(12) United States Patent
Hashigami et al.

(10) Patent No.: US 9,887,312 B2
(45) Date of Patent: Feb. 6, 2018

(54) SOLAR CELL AND SOLAR-CELL MODULE

(71) Applicant: SHIN-ETSU CHEMICAL CO., LTD., Tokyo (JP)

(72) Inventors: Hiroshi Hashigami, Annaka (JP); Takenori Watabe, Annaka (JP); Mitsuhito Takahashi, Annaka (JP); Shintarou Tsukigata, Annaka (JP); Takashi Murakami, Annaka (JP); Ryo Mitta, Annaka (JP); Yoko Endo, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 188 days.

(21) Appl. No.: 14/921,473

(22) Filed: Oct. 23, 2015

(65) Prior Publication Data

US 2016/0079466 A1 Mar. 17, 2016

Related U.S. Application Data

(62) Division of application No. 13/991,978, filed as application No. PCT/JP2011/077784 on Dec. 1, 2011, now abandoned.

(30) Foreign Application Priority Data

Dec. 6, 2010 (JP) .................................. 2010-271619

(51) Int. Cl.
*H01L 31/0224* (2006.01)
*H01L 31/18* (2006.01)
(Continued)

(52) U.S. Cl.
CPC .... *H01L 31/1804* (2013.01); *H01L 31/02167* (2013.01); *H01L 31/022425* (2013.01);
(Continued)

(58) Field of Classification Search
CPC ......... H01L 31/1804; H01L 31/022425; H01L 31/068; H01L 31/02167; H01L 31/1868
(Continued)

(56) References Cited

U.S. PATENT DOCUMENTS

| 5,928,438 A | 7/1999 | Salami |
| 6,632,730 B1 * | 10/2003 | Meier .................. H01L 21/228 |
| | | 257/E21.153 |

(Continued)

FOREIGN PATENT DOCUMENTS

| EP | 0 999 598 A1 | 5/2000 |
| JP | 05-036998 A | 2/1993 |

(Continued)

OTHER PUBLICATIONS

Office Action dated Dec. 30, 2015, issued in counterpart Chinese Patent Application No. 201180065728.7, with English translation. (25 pages).

(Continued)

*Primary Examiner* — Jayne Mershon
(74) *Attorney, Agent, or Firm* — Westerman, Hattori, Daniels & Adrian, LLP

(57) ABSTRACT

A solar cell wherein: an emitter layer is formed on a light-receiving-surface side of a crystalline silicon substrate, with a dopant of the opposite conductivity type from the silicon substrate added to said emitter layer; a passivation film is formed on the surface of the silicon substrate; and an extraction electrode and a collector electrode are formed. Said extraction electrode extracts photogenerated charge from the silicon substrate, and said collector electrode contacts the extraction electrode at least partially and collects the charge collected at the extraction electrode. The extraction electrode contains a first electrode that consists of a sintered conductive paste containing a dopant that makes (Continued)

silicon conductive. Said first electrode, at least, is formed so as to pass through the abovementioned passivation layer. The collection electrode contains a second electrode that has a higher conductivity than the aforementioned first electrode. This invention reduces contact-resistance losses between the silicon and the electrodes, resistance losses due to electrode resistance, and optical and electrical losses in the emitter layer, thereby greatly improving the characteristics of the solar cell.

20 Claims, 4 Drawing Sheets

(51) Int. Cl.
*H01L 31/068* (2012.01)
*H01L 31/0216* (2014.01)

(52) U.S. Cl.
CPC ........ *H01L 31/068* (2013.01); *H01L 31/1868* (2013.01); *Y02E 10/547* (2013.01); *Y02P 70/521* (2015.11)

(58) Field of Classification Search
USPC ............................................ 438/57; 136/254
See application file for complete search history.

(56) References Cited

U.S. PATENT DOCUMENTS

| | | | |
|---|---|---|---|
| 2002/0148499 A1* | 10/2002 | Tanaka | H01L 31/02242 136/256 |
| 2003/0160026 A1 | 8/2003 | Klein et al. | |
| 2005/0194037 A1 | 9/2005 | Asai | |
| 2007/0209697 A1 | 9/2007 | Karakida et al. | |
| 2009/0250108 A1 | 10/2009 | Zhou et al. | |
| 2009/0260684 A1 | 10/2009 | You | |
| 2010/0126551 A1 | 5/2010 | Okamoto et al. | |
| 2010/0132792 A1 | 6/2010 | Kim et al. | |
| 2010/0147378 A1 | 6/2010 | Lee et al. | |
| 2010/0218826 A1* | 9/2010 | Hahn | H01L 31/068 136/261 |
| 2010/0252105 A1* | 10/2010 | Fork | B29C 47/026 136/256 |
| 2012/0052191 A1* | 3/2012 | Fork | B05C 5/0212 427/75 |

FOREIGN PATENT DOCUMENTS

| | | |
|---|---|---|
| JP | 06-252428 A | 9/1994 |
| JP | 11-512886 A | 11/1999 |
| JP | 2000-138386 A | 5/2000 |
| JP | 2003-529207 A | 9/2003 |
| JP | 2003-531807 A | 10/2003 |
| JP | 2004-273826 A | 9/2004 |
| JP | 2006-041309 A | 2/2006 |
| JP | 2006-156693 A | 6/2006 |
| JP | 2007-096040 A | 4/2007 |
| JP | 2007-299844 A | 11/2007 |
| JP | 2008-204967 A | 9/2008 |
| JP | 2009-295715 | * 12/2009 |
| JP | 2009-295715 A | 12/2009 |
| WO | 2006/129444 A1 | 12/2006 |
| WO | 2009/128679 A2 | 10/2009 |
| WO | 2010/119512 A1 | 10/2010 |

OTHER PUBLICATIONS

Internal Search Report for PCT/JP2011/077784, dated Jan. 10, 2012; With English translation.
Singaporean Search Report dated Nov. 5, 2014, issued in Singaporean application No. 2013043831 (8 pages)(corresponding to U.S. Appl. No. 13/991,978) (8 pages).
Singapore Written Opinion dated Nov. 5, 2014, issued in corresponding Singapore application No. 2013043831 (11 pages).
Knobloch. J., et al. "High-Efficiency Solar Cells From FZ, CZ and MC Silicon Material", Proc. The 23rd IEEE Photovoltaic Specialists Conference, 1993, pp. 271-276.
D. L. Meier et al., "Self-Doping Contacts to Silicon Using Silver Coated With a Dopant Source", Proc. the 28th IEEE Photovoltaic Specialists Conference, pp. 69-74, (2000), U.S. Appl. No. 13/991,978.
International Written Opinion for PCT/JP2011/077787, dated Jan. 10, 2012.
Chinese Office Action dated Apr. 23, 2015, issued in corresponding CN Patent Application No. 201180065728.7 with English translation (26 pages).
US Non Final Office Action dated Apr. 24, 2015, issued in related U.S. Appl. No. 13/991,978 (30 pages).
U.S. Final Office Action dated Apr. 3, 2015, issued in U.S. Appl. No. 13/992,015 (17 pages).
Glunz. S.W., et al. "New Simplified Method for Patterning the Rear Contact of RP-Perc High-Efficiency Solar Cells", Proc. The 28th IEEE Photovoltaic Specialists Conference, 2000, pp. 168-171 U.S. Appl. No. 13/992,015.
U.S. Non-Final Office Action dated Nov. 6, 2014, issued in U.S. Appl. No. 13/992,015 (16 pages).
International Search Report for PCT/JP2011/077784 (corresponding to U.S. Appl. No. 13/991,978), dated Jan. 10, 2012; With English translation (4 pages).

* cited by examiner

SOLAR CELL AND SOLAR-CELL MODULE

CROSS-REFERENCE TO RELATED APPLICATION

The application is a Divisional of U.S. patent application Ser. No. 13/991,978, filed on Jun. 6, 2013, which is a National Stage of International Application No. PCT/JP2011/077784, filed on Dec. 1, 2011, which claims the benefit of priority from the prior Japanese Patent Application No. 2010-271619, filed on Dec. 6, 2010, the entire contents of which are incorporated herein by reference.

TECHNICAL FIELD

This invention relates to a solar cell and solar cell module having the advantages of low cost and high efficiency.

BACKGROUND ART

FIG. 1 illustrates one general solar cell of mass production model using a mono- or polycrystalline silicon substrate. The solar cell includes a p-type silicon substrate 101 obtained by doping monocrystalline silicon with a dopant such as B or Ga. An emitter layer 102 is formed in a light-receiving surface of silicon substrate 101 by heat treatment to diffuse a dopant for imparting n-type conductivity such as P or Sb into silicon substrate 101 in a high concentration. A plurality of extraction electrodes 104 of several hundreds to several tens of microns (μm) wide are disposed contiguous to the emitter layer 102 for extracting photogenerated electric charge from substrate 101. Also, several collector electrodes 105 of several millimeters (mm) wide are disposed for collecting the charges drawn in extraction electrodes 104 and interconnecting solar cells together. While these electrodes may be formed by various methods, one method commonly employed from the standpoint of cost is by printing a metal paste comprising fine particles of metal such as Ag and an organic binder through a screen or the like, and heat treating at a temperature of several hundreds to about 850° C. for bonding to the substrate. On the surface of the substrate opposite to the light-receiving surface, a back electrode 107 of opposite polarity to the light-receiving side electrode is formed by using a metal paste comprising fine particles of metal such as Al or Ag and an organic binder, screen printing, and firing at a temperature of about 700 to 850° C. Between silicon substrate 101 and back electrode 107, an electric field layer 106 containing a dopant for imparting the same p-type conductivity as the substrate such as Al, B or Ga in a high concentration is formed for efficiently extracting charge generated on the back side to the outside. Further, in the region where light is incident on the solar cell, a passivation film 103 is formed for optical confinement. A silicon nitride film which is formed by chemical vapor deposition (CVD) or the like is commonly used as the passivation film.

The passivation film also has a further important function of passivating the silicon surface. In the interior of crystals, silicon atoms are in a stable state due to the covalent bond between adjacent atoms. However, at the surface corresponding to the terminus of atom arrangement, where no adjacent atom to be bonded is available, an unstable energy level known as "dangling bond" appears. Since the dangling bond is electrically active, it captures and extinguishes charge photogenerated within silicon, detracting from the operation of a solar cell. Thus, the solar cells have been subjected to surface passivating treatment or otherwise treated to form an electric field such that photogenerated carriers may not be captured by dangling bonds. A silicon nitride film formed by CVD is widely used because its optical properties are suited for silicon solar cells and because the film itself has a positive fixed charge and also has a high passivation effect due to the inclusion of much hydrogen capable of passivating dangling bonds.

On the other hand, in the emitter layer where electric charge is present at a high density, direct recombination of electrons and holes, known as Auger recombination, becomes outstanding, detracting from the operation of a solar cell. Also, a photon-absorption phenomenon by free charge, known as free carrier absorption, becomes prominent to reduce the amount of photogenerated charge. Accordingly, the dopant concentration of the emitter layer should desirably be kept as low as possible or the depth of the emitter layer should desirably be shallow. However, reducing the dopant concentration, in turn, increases the contact resistance between silicon and metal electrode, giving rise to the problem of an increased resistance loss of generated power. Also formation of a shallow emitter layer is difficult to control, making it difficult to maintain a high production yield on the mass production level. Even if a shallow emitter layer can be formed, the electrode can penetrate through the emitter layer during electrode formation including firing step. This frequently results in a phenomenon that no solar cell performance is available.

Approaches for avoiding these problems include a method of selectively adding a dopant to an electrode-forming region in a high concentration while adding no dopant to a non-electrode-forming region (known as "localized doping"), and a method of adding a dopant in a relatively low concentration (known as "double doping").

The localized doping structure or double doping structure is generally formed by forming a dielectric film of several hundreds of nanometers (nm) such as a silicon oxide or silicon nitride film on substrate surface as diffusion barrier, opening an electrode-forming portion of the dielectric film by photolithography (see, for example, J. Knobloch, A. Noel, E. Schaffer, U. Schubert, F. J. Kamerewerd, S. Klussmann, W. Wettling, Proc. the 23rd IEEE Photovoltaic Specialists Conference, p. 271, 1993), etching paste (see, for example, JP-A 2003-531807), or laser ablation, and heat treating in a heat-treatment furnace for vapor phase diffusion of a dopant only through the opening. These methods, however, are not suited at all for mass production because they include complex steps or need expensive materials or apparatus.

One simpler method suited for mass production is by premixing a dopant in a conductive paste as the electrode-forming material, as proposed in, for example, D. L. Meier, H. P. Davis, R. A. Garcia, J. A. Jessup, Proc. the 28th IEEE Photovoltaic Specialists Conference, p. 69, 2000. With this method, P is added to Ag paste as dopant, for example, the paste is printed onto a silicon substrate, and the paste is fired at or above the eutectic point of Ag and Si. While the portion of silicon onto which the Ag paste has been applied is once melted and recrystallized upon cooling, P in the Ag paste is taken into the silicon, whereby a high concentration P-doped region is formed immediately below the electrode-forming portion. This method is commonly referred to as "self-doping" and the conductive paste for implementing the method is referred to as "self-doping paste." The above article reports that the method actually results in a good electrical contact between Ag and Si.

On the other hand, the self-doping paste contains a dopant for forming a self-doped region, an additive for effectively forming a high-concentration doping layer, and the like in relatively high proportions. For this reason, while the self-doping paste provides a good electrical contact between electrode and silicon, the content of metal particles contributing to the conduction of charge extracted from the silicon substrate must be kept low. As a result, the sintered body of self-doping paste has a high interconnect resistance, giving rise to the problem that the output of the solar cell is reduced.

SUMMARY OF INVENTION

Technical Problem

An object of the invention which is made under the aforementioned circumstances is to provide a solar cell and solar cell module having the advantages of a good electrical contact between a silicon substrate and an extraction electrode, a reduced loss by electrode interconnect resistance, and excellent cell characteristics.

Solution to Problem

Making extensive investigations to attain the above object, the inventors have found that if a first electrode in the form of a sintered body of conductive paste containing a dopant for imparting conductivity to silicon is used as the extraction electrode, and a second electrode having a higher conductivity than the first electrode is used as the collector electrode, then the loss by contact resistance between silicon substrate and the extraction electrode and the loss by electrode resistance are reduced and solar cell characteristics are drastically improved. The invention is predicated on this finding.

Accordingly, the invention provides a solar cell and solar cell module as defined below.

[1] A solar cell comprising a crystalline silicon substrate of one conductivity type having a light-receiving surface, an emitter layer formed on the light-receiving surface side of the substrate and having a dopant of opposite conductivity type added thereto, a passivation film formed on the surface of the substrate, an extraction electrode for extracting photogenerated charge from the silicon substrate, and a collector electrode in contact with at least a portion of the extraction electrode for collecting the charge drawn in the extraction electrode, characterized in that the extraction electrode includes a first electrode in the form of a sintered conductive paste containing a dopant for imparting conductivity to silicon, at least the first electrode is formed so as to penetrate through the passivation layer, and the collector electrode includes a second electrode having a higher conductivity than the first electrode.

[2] The solar cell of [1] wherein below the interface between the emitter layer of the silicon substrate and the first electrode, a self-doped region is formed as a result of the dopant in the first electrode being diffused during the sintering step.

[3] The solar cell of [1] or [2] wherein the self-doped region has a lower resistivity than the emitter layer disposed adjacent thereto.

[4] The solar cell of any one of [1] to [3] wherein the first electrode is formed of a conductive paste based on Ag and containing B, Al, Ga, P, As, In or Sb alone or a compound thereof or a combination thereof as the dopant.

[5] The solar cell of any one of [1] to [4] wherein the first electrode is partially contacted or entirely overlaid with the second electrode.

[6] The solar cell of any one of [1] to [5] wherein the extraction electrode has a laminate structure consisting of the first and second electrodes, and the collector electrode has a monolayer structure consisting of the second electrode.

[7] The solar cell of any one of [1] to [5] wherein the extraction electrode and the collector electrode each have a laminate structure consisting of the first and second electrodes.

[8] The solar cell of any one of [1] to [5] wherein the extraction electrode consists of the first electrode, and the collector electrode consists of the second electrode.

[9] The solar cell of any one of [1] to [8] wherein the passivation film comprises silicon oxide, silicon nitride, silicon carbide, aluminum oxide, amorphous silicon, microcrystalline silicon or titanium oxide or a combination thereof.

[10] A solar cell comprising a crystalline silicon substrate having a non-light-receiving surface, a passivation film formed on the non-light-receiving surface of the substrate, an extraction electrode for extracting photogenerated charge from the silicon substrate, and a collector electrode disposed at least partially in contact with the extraction electrode for collecting the charge collected in the extraction electrode, characterized in that the extraction electrode includes a first electrode in the form of a sintered conductive paste containing a dopant for imparting conductivity to silicon, at least the first electrode is formed so as to penetrate through the passivation layer, and the collector electrode includes a second electrode having a higher conductivity than the first electrode.

[11] The solar cell of [10] wherein at the interface between the silicon substrate and the first electrode, a self-doped region is formed as a result of the dopant in the first electrode being diffused during the sintering step.

[12] The solar cell of [10] or [11] wherein the self-doped region has a lower resistivity than a non-self-doped region disposed adjacent thereto.

[13] The solar cell of any one of [10] to [12] wherein the first electrode is formed of a conductive paste based on Ag and containing B, Al, Ga, P, As, In or Sb alone or a compound thereof or a combination thereof.

[14] The solar cell of any one of [10] to [13] wherein the first electrode is partially contacted or entirely overlaid with the second electrode.

[15] The solar cell of any one of [10] to [14] wherein the extraction electrode has a laminate structure consisting of the first and second electrodes, and the collector electrode has a monolayer structure consisting of the second electrode.

[16] The solar cell of any one of [10] to [14] wherein the extraction electrode and the collector electrode each have a laminate structure consisting of the first and second electrodes.

[17] The solar cell of any one of [10] to [14] wherein the extraction electrode consists of the first electrode, and the collector electrode consists of the second electrode.

[18] The solar cell of any one of [10] to [17] wherein the passivation film comprises silicon oxide, silicon nitride, silicon carbide, aluminum oxide, amorphous silicon, microcrystalline silicon or titanium oxide or a combination thereof.

[19] A solar cell module comprising electrically connected solar cells according to any one of [1] to [18].

Advantageous Effects of Invention

In a solar cell comprising extraction and collector electrodes, a self-doping electrode and a high conductivity electrode are used as the extraction electrode and collector electrode, respectively. Then the loss by silicon-electrode contact resistance and the loss by electrode resistance are reduced and at the same time, optical and electric losses in the emitter layer are reduced. Solar cell characteristics are drastically improved. Also, the process can be implemented by conventional screen printing and similar techniques, which is quite effective for cost savings.

DESCRIPTION OF EMBODIMENTS

Figure 1:
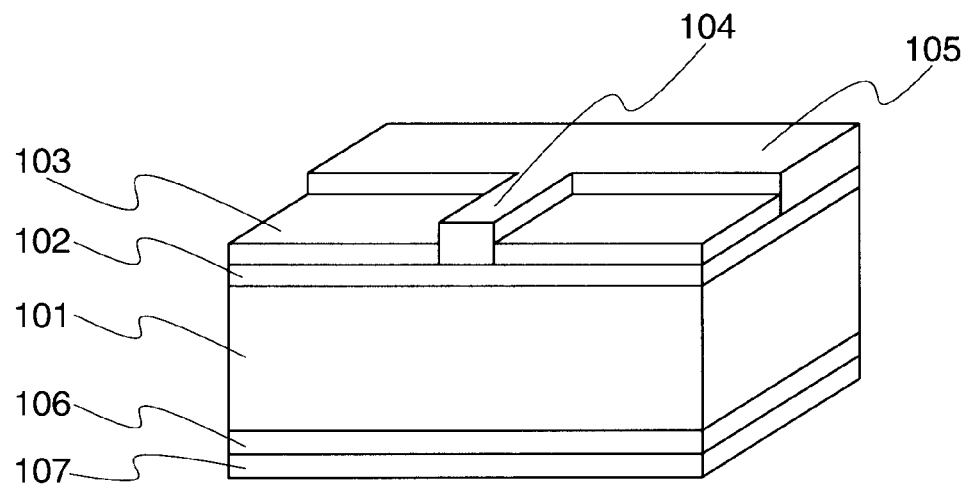
FIG. 1 is a schematic perspective view of an exemplary structure of a conventional solar cell.

Referring to FIGS. 2 to 8, several embodiments of the invention are described below. Like reference characters designate like or corresponding parts throughout the several views while their description is sometimes omitted.

Figure 2:
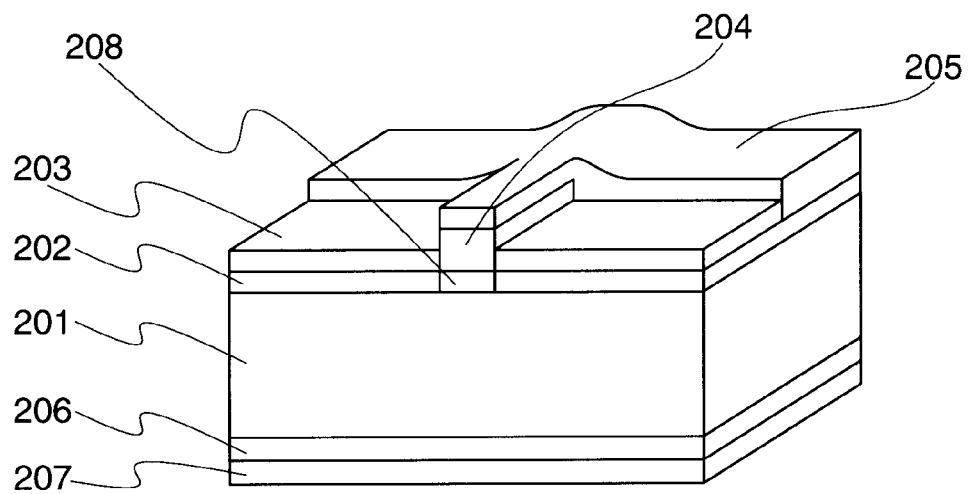
FIG. 2 is a schematic perspective view of an exemplary structure of a solar cell in one embodiment of the invention.

FIG. 2 illustrates a solar cell in one embodiment of the invention. The solar cell includes a crystalline silicon substrate 201 of one conductivity type, an emitter layer 202 formed on the silicon substrate 201 and having a dopant of opposite conductivity type added thereto, a passivation film 203 formed on the surface of the emitter layer 202, an extraction electrode for extracting photogenerated electric charge from the silicon substrate 201, and a collector electrode for collecting the charge drawn in the extraction electrode, wherein the electrodes are formed by printing and firing conductive paste. The extraction electrode includes a first electrode 204 in the form of a sintered body of conductive paste containing a dopant for imparting the same conductivity type as the emitter layer to silicon. The first electrode 204 is formed so as to penetrate through the passivation layer 203, and at the same time, a self-doped region 208 into which the dopant from the first electrode 204 is diffused at a high concentration is formed immediately below the first electrode 204. This enables to establish a good electrical contact between the first electrode 204 and the silicon substrate 201 and to reduce the dopant concentration or depth of the emitter layer 202, and eventually to ameliorate any degradation of solar cell characteristics due to carrier recombination and free carrier absorption in the emitter layer. Further the collector electrode includes a second electrode 205 having a higher conductivity than the first electrode 204, which enables to significantly reduce the output power loss of the solar cell by interconnect resistance.

Notably, an electric field layer 206 and a back electrode 207 are illustrated.

Now, one exemplary method of fabricating a solar cell according to the invention is described. The invention is not limited to the solar cell fabricated by this method.

An as-cut monocrystalline {100} p-type silicon substrate in which high purity silicon is doped with a Group III element such as B or Ga so as to give a resistivity of 0.1 to 5 Ω-cm is etched with a conc. alkali solution of sodium hydroxide or potassium hydroxide having a concentration of 5 to 60% by weight or mixed acid of hydrofluoric acid and nitric acid for removing the work damaged surface layer. The monocrystalline silicon substrate may have been prepared by either the CZ or FZ method.

Subsequently, the substrate surface is provided with microscopic asperities known as texture. The texture is an effective means for lowering the reflectivity of solar cells. The texture may be readily provided by immersing the substrate in a hot alkaline solution of sodium hydroxide, potassium hydroxide, potassium carbonate, sodium carbonate, sodium hydrogencarbonate or tetramethylammonium hydroxide (concentration 1 to 10 wt %) at a temperature of 60 to 100° C. for about 10 to about 30 minutes. Often, a proper amount of 2-propanol is dissolved in the alkaline solution to control the reaction.

The texturing is followed by washing with an aqueous acidic solution such as hydrochloric acid, sulfuric acid, nitric acid or hydrofluoric acid or a mixture thereof. Washing with hydrochloric acid is preferred from the cost and property standpoints. To enhance cleanness, washing may be carried out by mixing 0.5 to 5 wt % of aqueous hydrogen peroxide with aqueous hydrochloric acid and heating at 60 to 90° C.

On the substrate, an emitter layer is formed by vapor phase diffusion using phosphorus oxychloride. The P concentration and depth of the emitter layer are determined by a balance of resistance to current flow through the emitter layer and surface passivation effect, or the like. Typically, they are determined such that the emitter layer may have a sheet resistance of 50 to 400 ohm/square (Ω/□) as measured by the four probe method.

In common silicon solar cells, a p-n junction must be formed only on the light-receiving surface. To this end, suitable means must be taken for avoiding any p-n junction on the back surface, for example, by carrying out diffusion while two substrates are mated together, or by etching away the diffusion layer on one side in aqueous alkaline solution or the like. At the end of diffusion, the glass formed on the surface is removed using hydrofluoric acid or the like.

Next, an antireflection/passivation film is formed on the light-receiving surface. Using a chemical vapor deposition system for film formation, a silicon nitride or similar film is deposited to a thickness of 80 to 125 nm, typically about 100 nm. Often a mixture of monosilane ($SiH_4$) and ammonia ($NH_3$) is used as the reactant gas although nitrogen may be used instead of $NH_3$. Also the desired refractive index may be obtained by using $H_2$ gas to dilute the film-forming species, to adjust the process pressure, or to dilute the reactant gas. The film is not limited to silicon nitride, and instead, silicon oxide, silicon carbide, aluminum oxide, amorphous silicon, microcrystalline silicon or titanium oxide may be used while it may be formed by heat treatment, atomic layer deposition or the like as well as chemical vapor deposition.

Next, a first electrode is formed on the emitter layer. For the first electrode, for example, a silver paste is used which is prepared by mixing silver powder, glass frit and dopant with an organic binder.

Since the conductivity type of the emitter layer in this embodiment is n-type, the dopant used herein is a Group V element such as P, In or Sb alone or a compound thereof or a combination thereof. The composition of the paste must be adjusted depending on the structure and type of a solar cell. When diphosphorus pentoxide is used, for example, it is formulated in a proportion of about 0.1 to 30% by weight, preferably 2 to 15% by weight. The type and amount of the organic binder are well known.

The paste is screen printed and fired or heat treated to establish conduction between the electrode and the silicon. This heat treatment is known as a fire-through phenomenon that during firing of silver paste, the silicon nitride film reacts with the glass frit and is thus decomposed, allowing the Ag particles to penetrate through the silicon nitride film to make electrical contact with the substrate. The fire-through technique is widely used in the manufacture of crystalline silicon solar cells.

Although the dopant in the silver paste diffuses, in part, into the silicon substrate to achieve self-doping even on heat treatment at a temperature of about 700 to 800° C. in the electrode firing temperature range commonly employed, firing at a temperature equal to or higher than 835° C., the eutectic point of Ag and Si, is recommended in order to form a self-doped region more effectively. On firing at or above the temperature, silicon reacts with silver and melts, and then recrystallizes while taking in additive dopant. As such, high concentration doping is accomplished, making a better electrical contact between the sintered silver and silicon.

The electrical contact resistance between silicon and electrode is correlated to the carrier concentration, that is, dopant concentration on silicon surface and the electrode material. Where an electrical contact is made between conventional printed silver electrode and silicon, it is believed that the dopant concentration on silicon surface must be at least $1\times10^{19}$ cm$^{-3}$, preferably at least $5\times10^{19}$ cm$^{-3}$.

The dopant concentration may be directly measured by secondary ion mass spectroscopy (SIMS) or the like. This quantitative measurement, however, is scarcely used in the production site because preparation of a sample is cumbersome and measurement requires skill.

For simpler measurement, the spreading resistance method is utilized. Specifically, the method is by abutting two metal probes against a silicon substrate, conducting current flow between the two points, and measuring a voltage drop thereacross. The spreading resistance is the voltage drop divided by the current value. Since the voltage drop occurs in principle at a minute domain near the contact point of the probe, this method enables evaluation of the minute domain. If the contact area between the probe and the silicon substrate is recognized, then the resistivity relative to the dopant concentration on silicon surface may be determined.

In order that the self-doped region function effectively, the resistivity of the region at its surface should preferably be 10 mΩ-cm or less, more preferably 2 mΩ-cm or less. The lower limit is usually at least 0.5 mΩ-cm though not critical.

Also, the resistivity of the emitter layer (formed in the light-receiving area) at its surface should preferably be as high as possible from the standpoint of suppressing the aforementioned optical loss and carrier recombination loss, but should preferably be somewhat low from the standpoint of increasing the photovoltage. That is, the resistivity of the emitter layer at its surface should fall in an optimum range. The optimum range is 5 to 50 mΩ-cm though it varies with the structure of a solar cell. On the other hand, to take the maximum advantage of dual doping structure, the emitter layer should be designed and controlled such that the resistivity of the emitter layer at its surface may be higher than the resistivity of the self-doped region.

After the first electrode is formed in this way, a second electrode is formed on the first electrode by screen printing and firing.

The second electrode should be endowed with a higher conductivity than the first electrode for the purpose of suppressing the interconnect resistance loss when the charge extracted from the silicon substrate to the first electrode flows to the collector electrode. Such an electrode may be prepared using a silver paste containing a higher proportion of silver particles, for example. The resistivity of the second electrode which is preferably lower should desirably be up to 5 μΩ-cm at most, more preferably up to 3 μΩ-cm.

With respect to the sequence of firing first and second electrodes, the steps of printing and firing the first electrode and the steps of printing and firing the second electrode may be separately performed as mentioned above. Alternatively, after the first electrode is printed and dried, the second electrode is printed, and single heat treatment is effected for firing both the electrodes at the same time.

Figure 3:
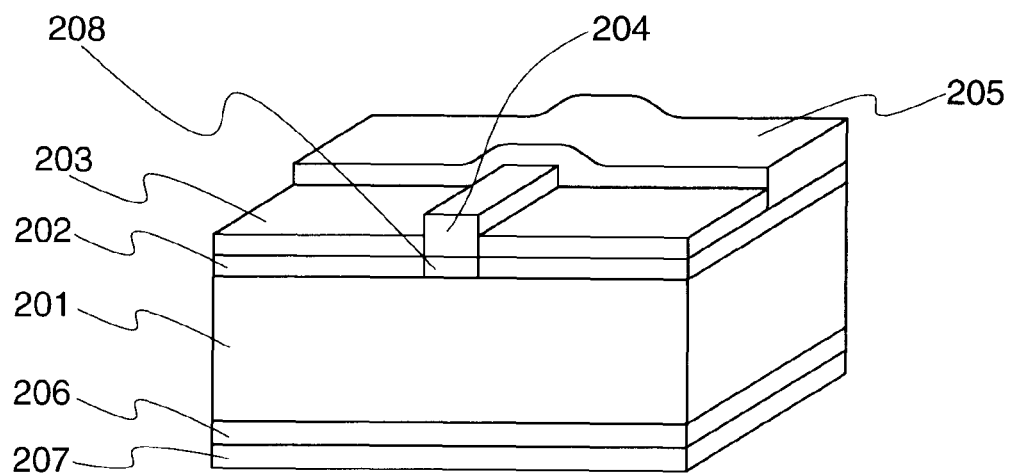
FIG. 3 is a schematic perspective view of an exemplary structure of a solar cell in another embodiment of the invention.

With respect to the extraction electrode and collector electrode, the extraction electrode may have a laminate structure consisting of first and second electrodes, and the collector electrode have a monolayer structure consisting of a second electrode as shown in FIG. 2. Alternatively, the extraction electrode may have a monolayer structure consisting of a first electrode, and the collector electrode have a monolayer structure consisting of a second electrode, as shown in FIG. 3.

Figure 4:
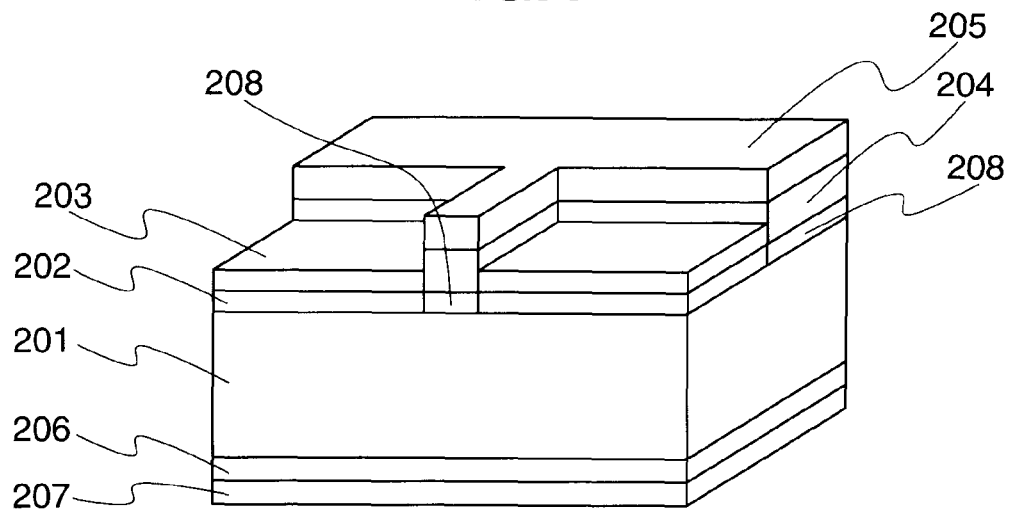
FIG. 4 is a schematic perspective view of an exemplary structure of a solar cell in a further embodiment of the invention.

Also, the extraction electrode and collector electrode each may have a laminate structure consisting of first and second electrodes as shown in FIG. 4.

Figure 5A:
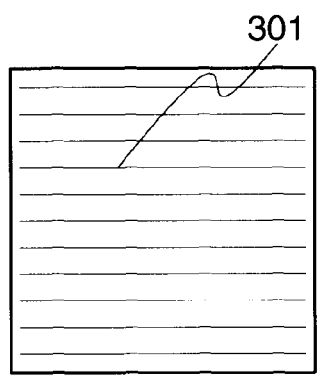
FIGS. 5A to 5C represent a plan view of a printing plate for use in electrode formation according to the invention, FIG. 5A showing a pattern of extraction electrode alone, FIG. 5B showing a pattern of collector electrode alone, and FIG. 5C showing a combined pattern of extraction and collector electrodes.
Figure 5B:
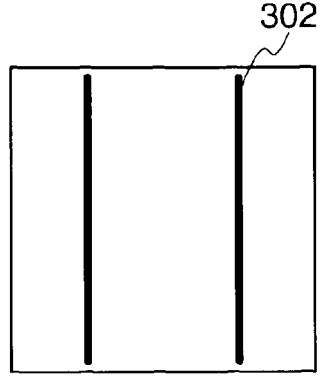
Figure 5C:
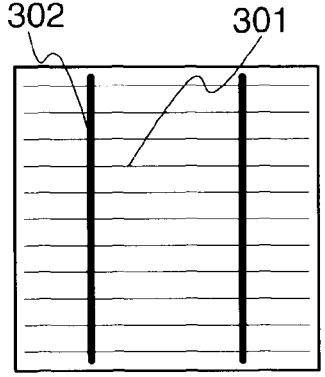

The structure of these electrodes may be prepared, for example, by screen printing an electrode paste to form, in case of the first electrode, a pattern consisting solely of extraction electrodes as shown in FIG. 5A, or a pattern of both extraction and collector electrodes as shown in FIG. 5C, and in case of the second electrode, a pattern as shown in FIG. 5C or a pattern consisting solely of collector electrodes as shown in FIG. 5B.

The electrode forming method is not limited to screen printing and may be performed by inkjet printing, dispenser, intaglio printing, aerosol spraying or the like. An electrode having a structure as shown in FIG. 4 may be prepared by effecting metallization, with the first electrode serving as seed, to form the second electrode. For metallization, electroplating, electroless plating or photo-plating is applicable.

Figure 6:
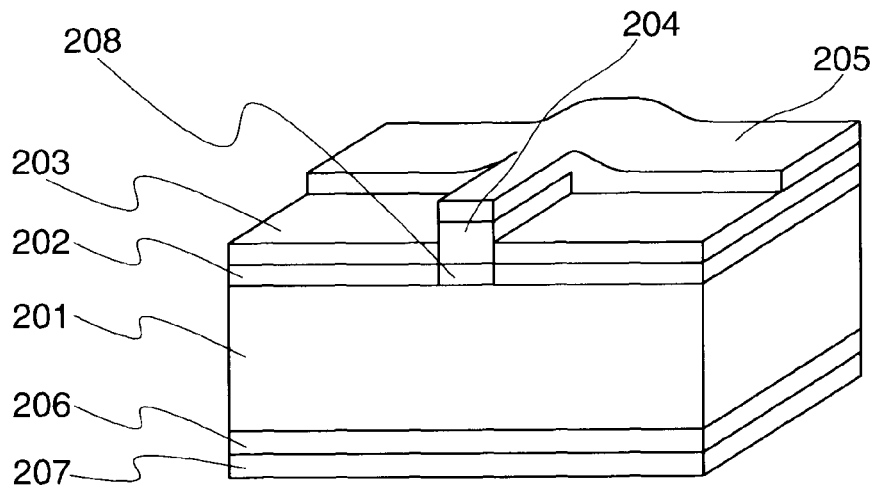
FIG. 6 is a schematic perspective view of an exemplary structure of a solar cell in a yet further embodiment of the invention.

In an embodiment wherein the collector electrode is a monolayer structure consisting of the second electrode, the second electrode may penetrate through the passivation layer 203, for example, by fire-through capability, until it contacts the emitter layer 202, as shown in FIGS. 2 and 3, or may not penetrate through the passivation layer 203 as shown in FIG. 6.

The embodiment of FIG. 6 wherein the passivation film immediately below the collector electrode is left intact inhibits recombination of carriers at the silicon surface in this portion, thus improving solar cell characteristics. The fire-through capability of electrode paste to penetrate through the passivation film is tailored by the amount of low-softening-point glass frit added. Accordingly, the second electrode may be formed using a high-temperature firing paste containing a relatively small amount of glass frit or free of glass frit, or a low-temperature cure resin paste.

The back electrode is formed by mixing aluminum powder with an organic binder and screen printing the resulting paste. Printing is followed by firing at a temperature of 700 to 900° C. for 5 to 30 minutes to form the back electrode and an electric field layer.

It is noted that the electric field layer may also be formed by vapor phase diffusion of boron bromide, for example. In this case, it is preferred from the standpoint of suppressing interconnect resistance to use silver paste to form the back electrode.

Firing of the back electrode and the light-receiving surface electrode may be performed at a time. Also, the order of forming electrodes on opposite surfaces may be reversed.

Back-Applied Embodiment

Figure 7:
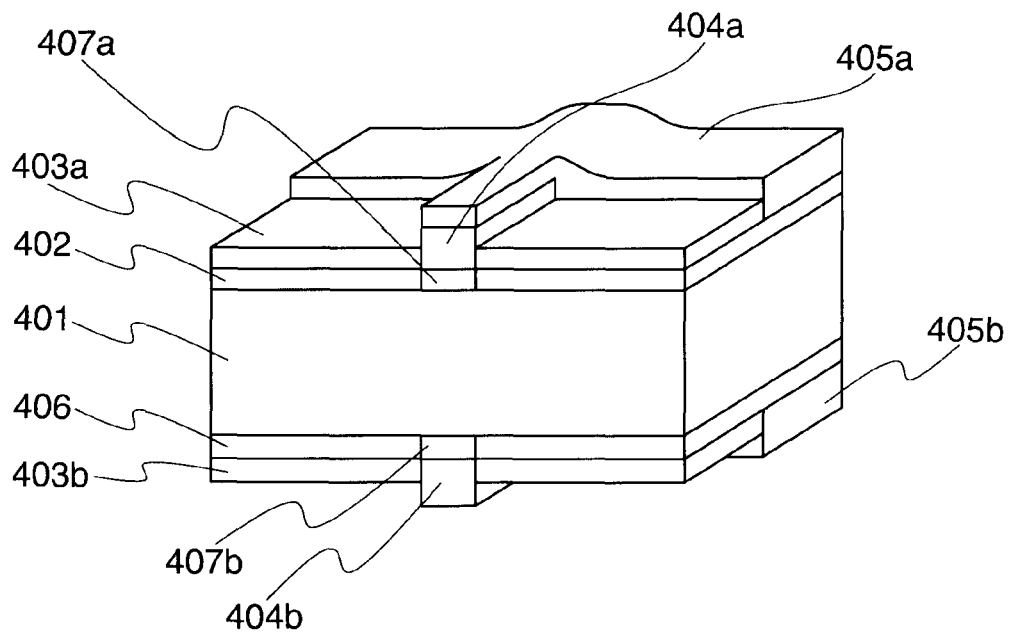
FIG. 7 is a schematic perspective view of an exemplary structure of a solar cell in a still further embodiment of the invention.

The electrode constructed by combining first and second electrodes according to the invention is also applicable to the non-light-receiving surface of the solar cell. FIG. 7 illustrates an embodiment wherein the electrode of the invention is applied to both the light-receiving surface and the non-light-receiving surface. While the p-type silicon solar cell uses the silicon substrate 401 of p-type conductivity, this embodiment is such that the self-doped region 407b formed immediately below the non-light-receiving side first electrode 404b is of p-type conductivity and the self-doped region 407a on the light-receiving side is of n-type conductivity. Thus, a self-doping paste containing a Group V element is used for the light-receiving side first electrode 404a and a self-doping paste containing a Group III element is used for the non-light-receiving side first electrode 404b. Also illustrated are an emitter layer 402, a passivation layer 403a, and collector electrodes 405a and 405b.

Such a structure on the non-light-receiving side allows the non-electrode-forming surface to be covered with the electric field layer 406 and passivation film 403b, enhancing the collection efficiency of photogenerated carriers. It is noted that the electric field layer 406 may not be formed where the passivation film has a fully high passivation effect.

The shape and construction of first and second electrodes 404b and 405b on the non-light-receiving side may be the same as the electrodes on the light-receiving side in FIGS. 2 to 6. Specifically, the extraction electrode on the non-light-receiving side may have a laminate structure consisting of first and second electrodes, and the collector electrode have a monolayer structure consisting of a second electrode; the extraction or collector electrode may have a monolayer structure consisting of a first or second electrode; or the extraction electrode and collector electrode each may have a laminate structure consisting of first and second electrodes.

Also, where the collector electrode on the non-light-receiving side has a monolayer structure consisting of second electrode 405b as in FIG. 7, the second electrode 405b may penetrate through the passivation layer 403b until it contacts the field effect layer 406 or silicon substrate 401, as shown in FIG. 7, or may not penetrate through the passivation layer.

On the non-light-receiving surface, a reflector (not shown) is preferably provided for taking in again the light transmitted by the substrate. Although the reflector may be a film of aluminum or silver formed by vacuum evaporation or the like, a sufficient reflector effect is obtainable simply by using a white backsheet or the like on the solar cell module without any additional treatment. Absent the reflector, electricity generation is yet possible by causing scattering light to enter from the back surface or by placing the solar cell such that the non-light-receiving surface may become a light-receiving side.

N-Type Substrate Embodiment

Although the solar cell of the invention is described by referring to the embodiments using p-type silicon substrates, the invention is equally applicable to a solar cell using an n-type silicon substrate.

In this embodiment, when reference is made to the structure of FIG. 7, silicon substrate 401, electric field layer 406 and self-doped region 407b on the non-light-receiving side are of n type and the emitter layer 402 and self-doped region 407a on the light-receiving side are of p type.

Herein, the silicon substrate 401 is a n-type crystalline silicon substrate which is prepared by doping high-purity silicon with a Group V element such as P or Sb to give a resistivity of 0.1 to 5 $\Omega$-cm. The emitter layer 402 may be formed when the silicon substrate is doped with boron by vapor phase diffusion using boron bromide, for example. Also the electric field layer may be formed by vapor phase diffusion using phosphorus oxychloride, for example. The self-doped layer 407a on the light-receiving side is formed using a self-doping paste containing a Group III element such as B, Al, Ga or In alone or a compound thereof or a combination thereof. The self-doped layer 407b on the non-light-receiving side is formed using a self-doping paste containing a Group V element such as P, As or Sb alone or a compound thereof or a combination thereof.

A plurality of solar cells according to the invention may be electrically connected and used as a solar cell module. In this embodiment, the connection may be made by any well-known methods.

EXAMPLES

Examples and Comparative Examples are given below by way of illustration and not by way of limitation.

Examples and Comparative Examples

To demonstrate the benefits of the invention, a solar cell having a conventional electrode structure and a solar cell having an electrode structure according to the invention are compared for electricity generating ability.

There were provided 90 as-cut boron-doped {100} p-type silicon substrates of 125 mm square having a diffusion depth of 250 µm and a resistivity of 1 $\Omega$-cm. The substrates were immersed in a hot conc. potassium hydroxide aqueous solution to remove the work damaged layer, immersed in a potassium hydroxide/2-propanol aqueous solution to form a texture, and then washed in a hydrochloric acid/hydrogen peroxide mixture. Next, the substrates, with their back surfaces mated, were heat treated at 870° C. in a phosphorus oxychloride atmosphere, for doping the light-receiving surface with phosphorus to form a p-n junction having a sheet resistance of 90 $\Omega$/□. Thereafter, the diffusion layer on the non-light-receiving surface was etched away with fluoronitric acid, and phosphorus glass was removed with hydrofluoric acid, followed by washing with deionized water and drying.

Thereafter, using a plasma-enhanced CVD system, a silicon nitride film was formed over the sample surface on the light-receiving side as a passivation film.

At this point of time, the substrates were divided into three groups (1), (2) and (3), each consisting of 30 substrates. Each of different silver pastes (see below) was printed on the substrates as a light-receiving side electrode using a printing screen having a pattern of extraction and collector electrodes on a common screen as shown in FIG. 5C. With respect to the printing conditions of electrode paste, conditions were previously selected and for each set of conditions, printing conditions such as printing pressure and squeeze angle were controlled such that an equivalent line width and cross-sectional area were obtained at the end of firing.

Group (1) is a comparative example by the prior art technique. As the first electrode, ordinary fire-through type high-temperature firing paste (paste A) was screen printed and dried. Then, high-conductivity silver paste (paste B) was screen printed as the second electrode so that the first electrode was completely overlaid therewith. Thereafter, firing at 830° C. or optimum condition was carried out in the ambient (air) atmosphere.

Group (2) is another comparative example by the prior art technique. As the first electrode, fire-through type self-doping silver paste (paste C) having a phosphorus compound added so that the self-doped region might have a resistivity of 2 mΩ-cm was screen printed and dried. Then, paste C was again screen printed as the second electrode so that the first electrode was completely overlaid therewith. Thereafter, firing at 880° C. or optimum condition was carried out in the ambient atmosphere.

Group (3) is an example of the invention. Paste C was screen printed and dried as the first electrode, and paste B was screen printed as the second electrode so that the first electrode was completely overlaid therewith. Thereafter, firing at 880° C. or optimum condition was carried out in the ambient atmosphere.

Next, all the solar cells on their back surface were coated with aluminum paste over their entire sample surface. Thereafter, firing at 780° C. or optimum condition was carried out in the ambient atmosphere.

For the solar cells of the three groups, the shape of light-receiving side electrode was examined by selecting 5 samples from each group, and measuring the line width and cross-sectional area of the electrode at nine (9) positions within the sample surface under a laser microscope. Table 1 reports an average of measurements for each group, demonstrating that electrodes of equivalent shape were obtained for all the groups.

TABLE 1

| Group No. | 1st electrode paste | 2nd electrode paste | Line width (μm) | Cross-sectional area (μm$^2$) |
|---|---|---|---|---|
| (1) Prior art | A | B | 109 | 1107 |
| (2) Prior art | C | C | 111 | 1079 |
| (3) Invention | C | B | 106 | 1083 |

Next, all the solar cells were measured for cell characteristics by a current-voltage tester using simulative sunlight with AM 1.5. Table 2 reports an average of solar cell characteristics for each group, demonstrating that the solar cells of group (3) within the scope of the invention show the best cell characteristics.

TABLE 2

| Group No. | Short-circuit current (mA/cm$^2$) | Open-circuit voltage (V) | Fill factor (%) | Conversion efficiency (%) |
|---|---|---|---|---|
| (1) Prior art | 35.0 | 0.636 | 76.6 | 17.1 |
| (2) Prior art | 35.1 | 0.635 | 78.2 | 17.4 |
| (3) Invention | 35.0 | 0.635 | 79.4 | 17.6 |

Next, 15 samples were selected from each group and measured for contact resistance between silicon substrate and electrode and interconnect resistance. Determination of contact resistance was by the ladder method. Determination of interconnect resistance was carried out by cutting out an extraction electrode portion from the solar cell sample, placing probes at opposite ends of the electrode and measuring current-voltage values.

Figure 8:
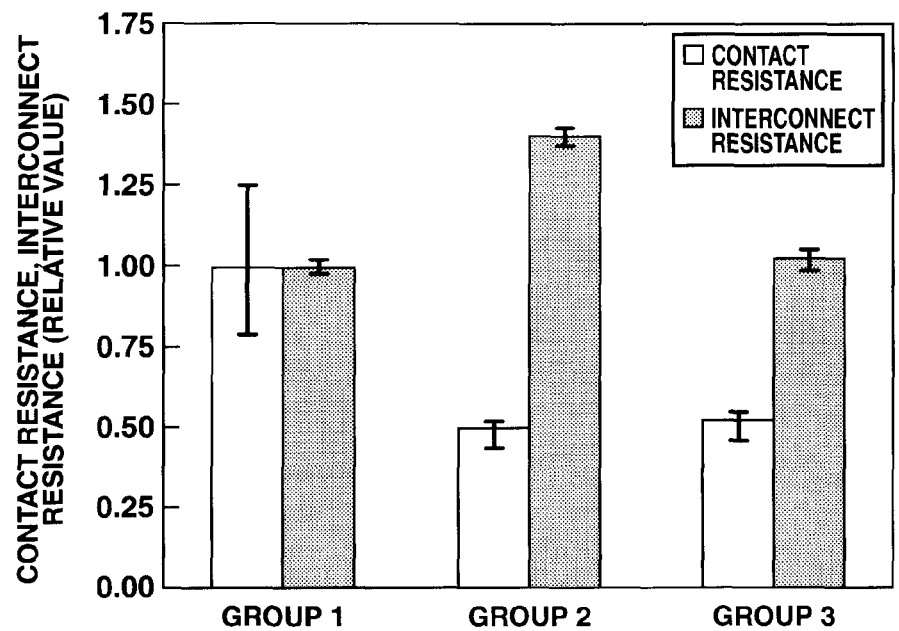
FIG. 8 is a diagram illustrating values of interconnect resistance and contact resistance in Example and Comparative Example.

FIG. 8 illustrates relative values of the two resistances for each group, provided that the average value of samples of group (1) is 1. It is seen that the samples of group (3) having the electrode structure according to the invention have a low contact resistance. It is thus concluded that the samples of group (3) show the highest fill factor in Table 2 as a result of the contact resistance and interconnect resistance being suppressed.

The invention claimed is:

1. A method for manufacturing a solar cell comprising a crystalline silicon substrate having a light-receiving surface, an emitter layer formed on the light-receiving surface side of the substrate, a passivation film formed on the emitter layer, an extraction electrode for extracting photogenerated charge from the silicon substrate, and a collector electrode in contact with at least a portion of the extraction electrode for collecting the charge drawn in the extraction electrode, comprising steps of:

forming the emitter layer on the light-receiving surface of the crystalline silicon substrate of one conductivity type by diffusion of a first dopant of opposite conductivity type added thereto, forming the passivation film on the emitter layer, forming a first electrode which is part of the extraction electrode at least by sintering a first conductive paste containing conductive powder, glass frit and a second dopant for imparting conductivity to silicon which is printed on the passivation film, wherein during sintering of the first conductive paste on the passivation film, the passivation film reacts with the glass frit in the first conductive paste and is decomposed, and the conductive powder in the first conductive paste penetrates through the passivation film to make electrical contact with the substrate, and wherein below the interface between the emitter layer of the silicon substrate and the first electrode, a self-doping region is formed as a result of the second dopant in the first electrode being diffused during the sintering step, and forming a second electrode having a higher conductivity than the first electrode, which is part of the collector electrode at least in contact with at least a portion of the extraction electrode by sintering a second conductive paste containing a higher proportion of conductive powder than the proportion in the first conductive paste which is printed on the first electrode at least.

2. The method of claim 1 wherein the self-doped region has a lower resistivity than the emitter layer disposed adjacent thereto.

3. The method of claim 1 wherein the first electrode is formed of the first conductive paste based on Ag and containing B, Al, Ga, P, As, In or Sb alone or a compound thereof or a combination thereof as the second dopant.

4. The method of claim 1 wherein the first electrode is partially contacted or entirely overlaid with the second electrode.

5. The method of claim 1 wherein the extraction electrode having a laminate structure consisting of the first and second electrodes, and the collector electrode having a monolayer structure consisting of the second electrode are prepared by screen printing the first conductive paste on the passivation film using a printing plate having a pattern consisting solely of an extraction electrode and screen printing the second conductive paste on the first electrode and the passivation film using a printing plate having a pattern of both extraction and collector electrodes so as to overlie the first electrode.

6. The method of claim 1 wherein the extraction electrode and the collector electrode each having a laminate structure consisting of the first and second electrodes are prepared by screen printing the first conductive paste on the passivation film using a printing plate having a pattern of both extraction and collector electrodes and screen printing the second conductive paste on the first electrode using a printing plate having a pattern of both extraction and collector electrodes so as to overlie the first electrode.

7. The method of claim 1 wherein the extraction electrode consisting of the first electrode, and the collector electrode consisting of the second electrode are prepared by screen printing the first conductive paste on the passivation film using a printing plate having a pattern consisting solely of an extraction electrode and screen printing the second conductive paste on the first electrode and the passivation film using a printing plate having a pattern consisting solely of collector electrode so as to overlie the first electrode.

8. The method of claim 1 wherein the passivation film comprises silicon oxide, silicon nitride, silicon carbide, aluminum oxide, amorphous silicon, microcrystalline silicon or titanium oxide or a combination thereof.

9. The method of claim 1 wherein the resistivity of the self-doped region at its surface is 2 mΩ·cm or less.

10. The method of claim 9 wherein the resistivity of the emitter layer at its surface is 5 to 50 mΩ·cm.

11. The method of claim 1 wherein the first conductive paste contains 2 to 15% by weight of the second dopant.

12. The method of claim 1 wherein the electrode firing temperature during sintering of the first conductive paste is equal to or higher than 835° C.

13. A method for manufacturing a solar cell comprising a crystalline silicon substrate having a non-light-receiving surface, a passivation film formed on the non-light-receiving surface of the substrate, an extraction electrode for extracting photogenerated charge from the silicon substrate, and a collector electrode in contact with at least a portion of the extraction electrode for collecting the charge drawn in the extraction electrode, comprising steps of:
forming the passivation film on the non-light-receiving surface of the substrate,
forming a first electrode which is part of the extraction electrode at least by sintering a first conductive paste containing conductive powder, glass frit and a dopant for imparting conductivity to silicon which is printed on the passivation film, wherein during sintering of the first conductive paste on the passivation film, the passivation film reacts with the glass frit in the first conductive paste and is decomposed, and the conductive powder in the first conductive paste penetrates through the passivation film to make electrical contact with the substrate, and wherein at the interface between the silicon substrate and the first electrode, a self-doping region is formed as a result of the dopant in the first electrode being diffused during the sintering step, and
forming a second electrode having a higher conductivity than the first electrode, which is part of the collector electrode at least in contact with at least a portion of the extraction electrode by sintering a second conductive paste containing a higher proportion of conductive powder than the proportion in the first conductive paste which is printed on the first electrode at least.

14. The method of claim 13 wherein the self-doped region has a lower resistivity than a non-self-doped region disposed adjacent thereto.

15. The method of claim 13 wherein the first electrode is formed of the first conductive paste based on Ag and containing B, Al, Ga, P, As, In or Sb alone or a compound thereof or a combination thereof.

16. The method of claim 13 wherein the first electrode is partially contacted or entirely overlaid with the second electrode.

17. The method of claim 13 wherein the extraction electrode having a laminate structure consisting of the first and second electrodes, and the collector electrode having a monolayer structure consisting of the second electrode are prepared by screen printing the first conductive paste on the passivation film using a printing plate having a pattern consisting solely of an extraction electrode and screen printing the second conductive paste on the first electrode and the passivation film using a printing plate having a pattern of both extraction and collector electrodes so as to overlie the first electrode.

18. The method of claim 13 wherein the extraction electrode and the collector electrode each having a laminate structure consisting of the first and second electrodes are prepared by screen printing the first conductive paste on the passivation film using a printing plate having a pattern of both extraction and collector electrodes and screen printing the second conductive paste on the first electrode using a printing plate having a pattern of both extraction and collector electrodes so as to overlie the first electrode.

19. The method of claim 13 wherein the extraction electrode consisting of the first electrode, and the collector electrode consisting of the second electrode are prepared by screen printing the first conductive paste on the passivation film using a printing plate having a pattern consisting solely of an extraction electrode and screen printing the second conductive paste on the first electrode and the passivation film using a printing plate having a pattern consisting solely of collector electrode so as to overlie the first electrode.

20. The method of claim 13 wherein the passivation film comprises silicon oxide, silicon nitride, silicon carbide, aluminum oxide, amorphous silicon, microcrystalline silicon or titanium oxide or a combination thereof.

* * * * *